United States Patent [19]
Fedeli et al.

[11] Patent Number: 4,881,198
[45] Date of Patent: Nov. 14, 1989

[54] DUPLICATOR IN A MAGNETIC BUBBLE MEMORY AND PROCESS FOR DUPLICATING BUBBLES THEREIN

[75] Inventors: Jean-Marc Fedeli, St. Egréve; Jöel Magnin, St. Martin d'Héres, both of France

[73] Assignee: Commissariat a l'Energie Atomique, Paris, France

[21] Appl. No.: 320,860

[22] Filed: Mar. 6, 1989

Related U.S. Application Data

[63] Continuation of Ser. No. 719,706, Apr. 4, 1985, abandoned.

[30] Foreign Application Priority Data

Apr. 5, 1984 [FR] France ................................. 84 05378

[51] Int. Cl.$^4$ ........................ G11C 19/08; G11C 11/42
[52] U.S. Cl. ......................................... 365/12; 365/36; 365/37
[58] Field of Search ....................... 365/12, 36, 37, 233

[56] References Cited

U.S. PATENT DOCUMENTS

| | | | |
|---|---|---|---|
| 4,253,159 | 2/1981 | Nelson .................................... | 365/36 |
| 4,415,988 | 11/1983 | Komenou et al. ..................... | 365/36 |
| 4,493,083 | 1/1985 | Kinoshita ........................... | 371/66 X |

FOREIGN PATENT DOCUMENTS

| | | | |
|---|---|---|---|
| 72696 | 2/1983 | European Pat. Off. . | |
| 0166586 | 10/1983 | Japan .................................... | 365/36 |
| 0200488 | 11/1983 | Japan .................................... | 365/36 |
| 0058685 | 4/1984 | Japan .................................... | 365/12 |

OTHER PUBLICATIONS

Urai et al, "A Major Line Bubble Replicator for Ion-Implanted Bubble Devices", Microelectronics Research Lab, NEC Ltd., Nov. 1982, p. 79.
RCA Technical Notes, No. 885, "Bubble Domain Constructions", by Kurlansik and Clover.
Komenou et al, "Design of a Block Replicate Gate for Ion-Implanted Bubble Devices", IEEE Trans. on Magnetics, vol. 18, No. 6, pp. 1352–1354.

*Primary Examiner*—Glenn A. Gossage
*Attorney, Agent, or Firm*—Michael N. Meller

[57] ABSTRACT

A duplicator in a magnetic bubble memory with non-implanted patterns, a process for realizing the duplicator and a serial - parallel magnetic bubble memory having at least one of the aforementioned duplicators are disclosed. In a magnetic bubble memory having a first group of aligned non-implanted patterns and a second group of aligned non-implanted patterns, the duplicator according to the invention is characterized in that it comprises an extension conductor and a breaking conductor, the extension conductor linking the first and second groups of patterns, the breaking conductor being positioned transversely with respect to the extension conductor, the geometry of the end pattern of the first group of patterns being such that the duplication position is a stable position and the geometry of the patterns of the second group adjacent the axis of the first group being such that the reception position of the duplicated bubble is a stable position.

6 Claims, 3 Drawing Sheets

FIG. 1
PRIOR ART
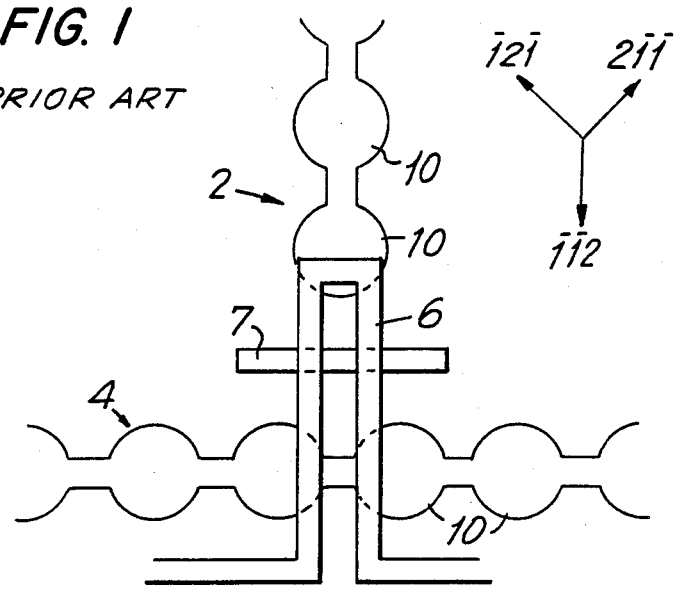
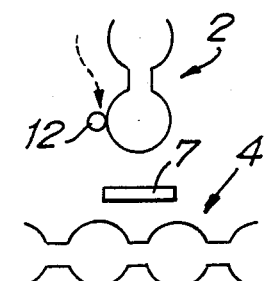
FIG. 2a
PRIOR ART
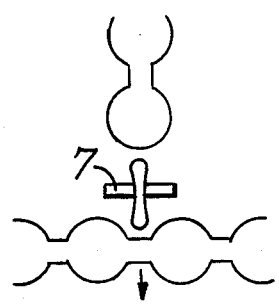
FIG. 2b
PRIOR ART
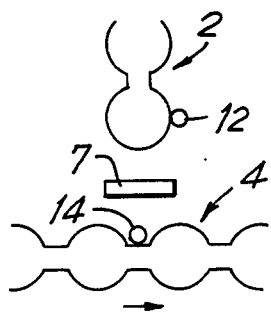
FIG. 2c
PRIOR ART
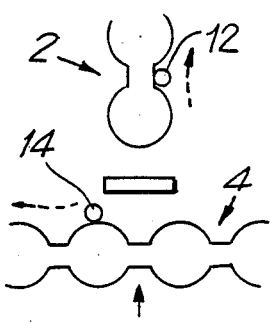
FIG. 2d
PRIOR ART FIG. 3
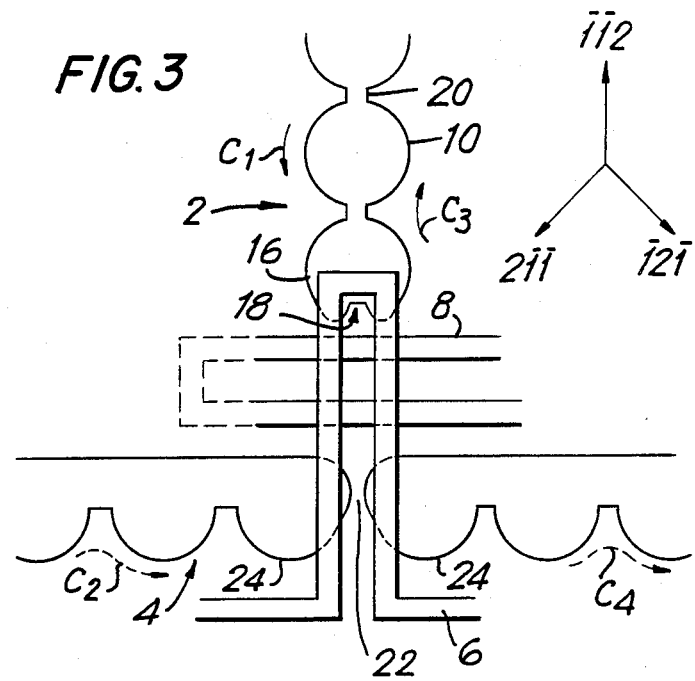
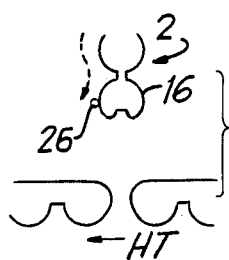
FIG. 4a
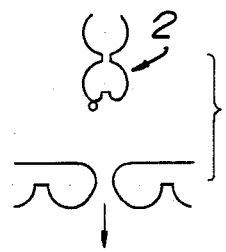
FIG. 4b
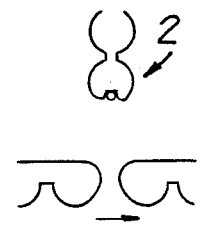
FIG. 4c
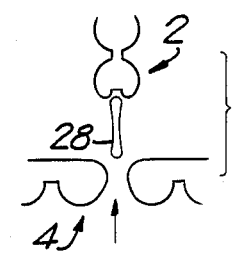
FIG. 4d
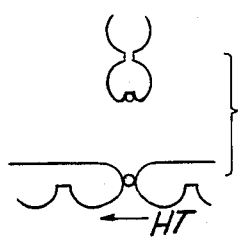
FIG. 4e
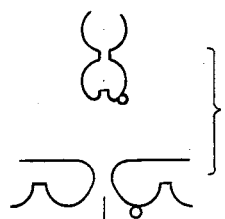
FIG. 4f
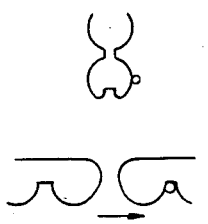
FIG. 4g
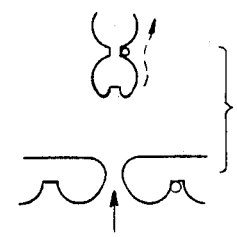
FIG. 4h

DUPLICATOR IN A MAGNETIC BUBBLE MEMORY AND PROCESS FOR DUPLICATING BUBBLES THEREIN

This application is a continuation of application Ser. No. 719,706, filed 4/4/85 now abandoned.

BACKGROUND OF THE INVENTION

The present invention relates to a duplicator in a magnetic bubble memory with non-implanted patterns and to a process for producing such a duplicator. It also relates to a magnetic bubble memory having at least one duplicator according to the invention.

The invention more particularly applies to the storage of binary information or bits, materialized in the form of separate magnetic domains called bubbles. These generally cylindrical domains have a magnetization which is the reverse of that of the remainder of the magnetic material (garnet) in which said domains are formed. In this memory, the duplication of the magnetic bubbles makes it possible to carry out duplication by individual bits or by bit blocks.

In a monocrystalline magnetic layer, such as a magnetic garnet film, supported by an amagnetic monocrystalline garnet, the domains or magnetic bubbles are stably formed by the application of a d.c. magnetic field Hp perpendicular to the plane of the magnetic layer. In practice, this magnetic field is produced by a permanent magnet, thus ensuring the non-volatility of the information contained in the memory.

In a magnetic bubble memory, the displacement of the bubbles is brought about by applying a rotary d.c. field $H_T$ in a direction parallel to the magnetic layer surface. The bubbles are displaced around so-called propagation patterns, defined in the upper part of the magnetic layer.

These patterns, which are in the form of disks, lozenges, triangles, T's, etc, can be made from a material based on iron and nickel, or can be obtained by implanting ions in the upper part of the magnetic layer, through a mask making it possible to define the shape of these patterns. In the latter case, in view of the fact that ion implantation only takes place around the patterns, the latter are called non-implanted patterns. The propagation patterns are generally contiguous and as a result of their shape, two adjacent patterns define two cavities or hollows between them.

The displacement of the bubbles along said patterns generally takes place during a period equal to one third of the rotation cycle of the planar magnetic field $H_T$, the bubbles remaining stationary in the cavities defined between two adjacent patterns throughout the remainder of the cycle. These cavities constitute so-called stable positions. Shift registers are formed, in which the bit 1 is represented by the presence of a bubble and the bit 0 by the absence of a bubble.

In addition to these propagation patterns, it is necessary to use electrical conductors for carrying out writing, information logging, non-destructive reading, register-to-register transfer and erase functions in the bubble memory.

One of the main types of known bubble memories comprises a system of so-called loops or registers used for the storage of information, associated with one or two so-called major loops or registers constituting the access stations to the memory. The minor loops are adjacently longitudinally arranged, whilst the major loops are oriented perpendicularly to the minor loops. The magnetic bubbles are located in the minor loops and can be transferred to the major loops and vice versa, by means of unidirectional or bidirectional transfer gates or ports.

When a single major loop is used, the reading and writing of information takes place by means of said single loop. In the first case, reference is made to a memory having a major-minor organization. However, when two major loops are used, the writing of information takes place by means of one of these two loops and the reading of the information by means of the other loop. These major loops are generally located on either side of minor loops. In the latter case (two loops), reference is generally made to a memory having a serial-parallel.

In the aforementioned bubble memories, the production of a bubble on a major loop, corresponding to the writing of an information bit is carried out by applying a high current to a generally U-shaped conductor, which passes through the propagation patterns forming the major loops. This operation, which is generally known as nucleation, is carried out when the bubble is in a cavity defined between two adjacent patterns.

Following nucleation, the bubble is propagated, by the application of the rotary field $H_T$, to the major loop, to the transfer gate, in order to transfer the bubble from the major loop to a minor loop. These transfer gates are generally constituted by a U-shaped conductor passing through the patterns forming the minor loop. The application of a current pulse to said conductor makes it possible to extend each bubble between the tops of the propagation patterns of the major loops and those corresponding to the minor loop and then, the stopping of the current pulse leads to the contraction of the bubbles on the minor loop. Transfer is then completed. Thus, the information is stored on the minor loop.

The reading of this information takes place by transferring a magnetic bubble from a minor loop to a major loop, said reading being destructive. The magnetic bubble is transferred to a detection path of the major loop, so that it can be destructively detected by a magnetoresistive detector, generally based on iron and nickel. In order not to lose the information during reading, it is necessary to duplicate the magnetic bubble. The daughter bubble can then be transferred to the magnetoresistive detector and the mother bubble will be reinjected into the site occupied by the original bubble in the minor loop.

A duplication method was described in U.S. Pat. No. 4,253,159, filed on Dec. 3, 1979 and entitled "Ion implanted bubble memory with replicate port". This patent uses a single major loop and non-implanted propagation patterns.

According to this patent, a magnetic bubble is transferred from a minor loop to the major loop. Duplication then takes place on the major loop by means of a conductor passing through it, to which is applied a current pulse. This leads to the elongation of the bubble on either side of the two parallel propagation paths formed by the two sides of the major loop, followed by the splitting of said bubble into two. One of these bubbles is then transferred on a detection path to the magnetoresistive detector and the other bubble is reinjected into the minor loop at the site occupied by the original bubble.

A magnetic bubble memory having as the propagation pattern non-implanted patterns and having a structure and operation such as described in the aforementioned U.S. Patent only makes it possible to carry out a duplication of the bubbles corresponding to a bit-by-bit duplication. These memories do not permit the duplication of a group or block of bits.

This reading method has at least two disadvantages. The first disadvantage results from the fact that the reading of an information bit requires, apart from the duplication of the bubble to be read, the transfer of said bubble from the minor loop to the major loop and then the reinjection, following duplication, of said bubble into the minor loop at the site which was previously occupied. Moreover, in order that duplication can take place correctly, it is necessary for the current pulse to be applied to the extension conductor at a very precise time with respect to the phase of the rotary field $H_T$. The phase margin on this current pulse is very small.

Another duplicator construction is known, which utilizes the same duplication method. A bubble to be duplicated is firstly transferred from a minor loop to the major loop and is then duplicated between the major loop and another propagation path. This duplication is carried out by two conductors, namely an extension conductor positioned between the major loop and the other propagation path and a current conductor perpendicular to the extension conductor. The bubble remaining on the major loop is supplied to the detector and the bubble produced by duplication on the other propagation path is returned to the minor loop.

As in the aforementioned U.S. patent, this duplication method does not appear to simply permit the duplication of bit blocks between minor loops and the major reading loop. Moreover, the phase margin between the extension and breaking current pulses and the rotary field $H_T$ remains very small, approximately 90 ns, which makes said duplication difficult in practice.

Magnetic bubble memories with non-implanted patterns are also known, whose structure permits a duplication of bit blocks.

The article "Design and characteristics of 4 μm period ion-implanted bubble devices with major line block replicate gate" published in IEEE TRANSACTIONS ON MAGNETICS, Vol. MAG-19, No. 5, September 1983, describes such a non-implanted pattern memory, in which iron-nickel patterns are positioned between each minor loop and a major loop. Reading takes place in three stages:
 transfer of the bubble on the minor loop to another iron-nickel pattern,
 duplication by applying a current pulse to a conductor covering the iron-nickel pattern,
 transfer of a bubble to the major loop and reinjection of the other bubble into the minor loop.

A memory having the structure and function of the types described in this article suffers from the disadvantage of requiring a double transfer of the bubble to be read. To this must be added the complexity of the construction of the memory, which has non-implanted patterns and iron-nickel patterns.

The article "Design of a block replicate gate for ion-implanted bubble devices" published in IEEE TRANSACTIONS ON MAGNETICS, Vol. MAG-18, No. 6, November 1982, describes a bubble memory in which a bubble to be read is directly duplicated without it being necessary to transfer it before and after duplication. An extension conductor is arranged along the minor loop axis, between the end of the minor loop and a stable position of the major loop. A breaking means is also arranged perpendicularly to the conductor between the minor loop and the major loop. This breaking means comprises either a paramagnetic bar formed by locally making the material amorphous by high ion implantation, or by a non-implanted pattern. FIG. 1 is a diagram illustrating duplication in a bubble memory with non-implanted patterns in accordance with said method.

FIG. 1 shows a minor loop 2, a major loop 4, an extension conductor 6 and a breaking means 7. The minor loop 2 comprises a succession on non-implanted patterns 10, which are aligned along an easy magnetization axis $\overline{112}$. The major loop 4 comprises non-implanted patterns 10 of an identical nature and aligned in a direction perpendicular to the axis of the minor loop 2. These non-implanted patterns are produced in a layer of magnetic material. The extension conductor 6 is then produced above said layer.

This extension conductor 6 is generally U-shaped and is centered on the axis of the minor loop 2. The base of extension conductor 6 is located in the vicinity of the end of the minor loop 2 and extends up to the major loop 4. The breaking means 7 is either a rectangle or a V-shape, and is centered on the axis of the extension conductor 6.

A bubble of the minor loop 2 is duplicated by applying a pulse to extension conductor 6, when said bubble is at the end of the minor loop 2 at the base of conductor 6. This current pulse extends the bubble up to the major loop 4. The breaking of this bubble is sided by the breaking means 7, whose presence produces a magnetic field. Thus, the bubble on the minor loop is duplicated without it being necessary to transfer it.

However, it is necessary to apply a contraction pulse to the extension conductor 6, when the bubble is extended in order that breaking or splitting takes place. The duration of this pulse must be less than approximately 50 ns to prevent the destruction of the bubbles. From the electronic standpoint it is difficult to achieve this short duration.

The displacement of the bubble with the rotary field will now be described with reference to FIGS. 2a to 2d in which the extension conductor is not shown. Each of these drawings show corresponding minor and major loops, as well as the phase of the rotary field $H_T$, indicated by an arrow.

In FIG. 2a, bubble 12 is substantially at the end of the minor loop 2. In FIG. 2b, it has reached said end and is expanded by applying a current pulse to the extension conductor. The presence of the breaking means aids the breaking or splitting of the bubble and, as a result of a contraction pulse in the extension conductor, the bubble is finally duplicated. FIGS. 2c and 2d illustrate the movement of the original bubble 12 on minor loop 2 and of the duplicated bubble 14 on the major loop 4.

It is known that the stable positions of the bubble, i.e. the positions in which the bubble can remain stationary for a large part (e.g. exceeding T/2) of the period T of the rotary field $H_T$, are constituted by cavities located at the junction of two consecutive non-implanted patterns. Between two successive cavities, the bubble is continuously displaced under the action of the rotary field $H_T$. The bubble 12 of the minor loop 2 is thus in a non-stable position, when expanded and broken or split in the manner shown in FIG. 2b. The extension and contraction current pulses must consequently be very short and very well synchronized in order that duplication takes place correctly. The phase error on these two pulses with respect to the rotary field $H_T$ is consequently very small.

SUMMARY OF THE INVENTION

The object of the present invention is to provide a duplicator incorporating an extension conductor and a breaking conductor for a magnetic bubble memory with non-implanted patterns, in which the phase constraints on the extension and breaking pulses are less severe. Moreover, the breaking of the bubble takes place in a manner independently of the extension, which permits a better control of the duplication. As a result, the duplication takes place with improved reliability and under better conditions.

More specifically, the present invention relates to a duplicator in a magnetic bubble memory having a magnetic material layer, in which magnetic bubbles can be displaced by applying a rotary field $H_T$ in first and second propagation paths, the first path being defined by a first group of non-implanted patterns aligned along a planar crystallographic axis with easy magnetization of the magnetic material, the second path being defined by a second group of non-implanted patterns aligned along an axis positioned transversely with respect to the axis of the first group of patterns, the duplicator being characterized in that an extension conductor is positioned between the end pattern of the first group of patterns and the second group of patterns, in that a breaking conductor is positioned transversely with respect to the extension conductor, between the two groups of patterns, in that the geometry of the end pattern of the first group of patterns is such that the duplication position on the first propagation path is a stable position and in that the geometry of the patterns of the second group adjacent the axis of the first group are such that the reception position of the duplicated bubble on the second propagation path is a stable position.

This duplicator can be used for duplicating a magnetic bubble between two random propagation paths of a bubble memory. The paths can in particular be a major reading loop and a minor loop.

According to a feature of the duplicator according to the invention, an implanted zone is formed in the end pattern facing the second group of patterns.

According to another feature of the duplicator according to the invention, an implanted zone is also formed in the center of the end pattern and an implanted gap, centered on the axis of the first group of patterns, connects said implanted zones.

According to another feature of the duplicator according to the invention, an implanted gap is formed between two patterns of the second group of patterns along the axis of the extension conductor. This implanted gap forms a joining element.

The present invention also relates to a duplication process in which a current pulse is applied to the extension conductor and a current pulse is applied to the breaking conductor, the extension pulse starting before the breaking pulse, and in which the extension pulse coincides in both phase and duration with the time at which the bubble is stationary in the duplication position.

According to a feature of the duplication process according to the invention, the breaking pulse starts before the end of the extension pulse.

According to another feature of the process according to the invention, the breaking pulse ends before the end of the extension pulse.

The invention finally relates to a magnetic bubble memory with non-implanted patterns and which comprises:
  a plurality of first groups of non-implanted patterns, called minor loops, which are aligned along a planar crystallographic axis for the easy magnetization of the magnetic material,
  a second group of non-implanted patterns, called the major writing loop, arranged perpendicularly to the minor loops,
  means for generating bubbles on the writing loop,
  means for the block transfer of a bit from the writing loop into each minor loop,
  a third group of non-implanted patterns, called the major reading loop, arranged perpendicular to the minor loops,
  means for detecting bubbles on the reading loop,
  and a duplication means according to the invention for the blockwise duplication of a bit of each minor loop in the reading loop.

BRIEF DESCRIPTION OF THE DRAWINGS

The invention is described in greater detail hereinafter with reference to non-limitative embodiments and with reference to the attached drawings, wherein.

FIGS. 1 and 2a to 2d show the prior art duplication of a magnetic bubble a bubble memory with non-implanted patterns.

FIG. 3 is a diagram of one end of a minor loop, a major loop and extension and breaking conductors constituting a duplicator according to the invention.

FIGS. 4a to 4b show the operation of the duplicator of FIG. 3.

DETAILED DESCRIPTION OF THE PREFERRED EMBODIMENTS

Figure 6:
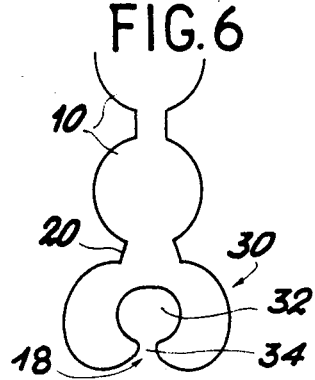
FIG. 6 shows a constructional variant of the end pattern of the minor loop.

FIG. 3 shows a minor loop 2, whose patterns are aligned along an easy magnetization axis $\overline{112}$, a major loop 4, an extension conductor 6 and a breaking conductor 8.

The U-shaped extension conductor 6 is centered on the axis of the minor loop 2. One of its ends covers the end pattern 16 of the minor loop 2 and also passes through the major loop 4. The breaking conductor 8 is secant with the extension conductor 6 and is generally perpendicular thereto.

According to the invention, the non-implanted end pattern 16 of minor loop 2 has a geometry such that the duplication position of a bubble is a stable position. In the case of the drawing, this is realized by an implanted zone 18 formed in that part of the end pattern 16 facing the major loop 4. As a result of this special geometry the duplication position is just as stable as the cavities 20 located at the junction of two consecutive non-implanted patterns.

In order to fully benefit from the time gained as a result of the duplication position being a stable position, the corresponding position on the major loop must also be a stable position. This is obtained by producing an implanted gap 22 between two non-implanted patterns 24 of the major loop 4. This gap makes it possible in per se known manner to join two propagation paths, which are in this case the path C1 represented by a line arrow along the minor loop 2 and the path C2 represented by a dotted arrow along the major loop 4.

The major loop 4 is a reading loop. The duplicated bubbles of the minor loop 2 or the bubbles coming from path C2 of major loop 4 are transferred by the propagation path C4 to a detector (not shown), e.g. a magnetoresistive detector.

A description will now be given, with reference to FIGS. 4a to 4h, of the duplication of a bubble of the minor loop. In each of these drawings is shown the magnetic bubble position as a function of the phase of the rotary field $H_T$ represented by an arrow.

In FIGS. 4a and 4b, the magnetic bubble 26 moves along the end pattern 16 of the minor loop 2. In FIGS. 4c, 4d and 4e, the bubble is stationary in the duplication position constituted by the implanted zones 18 of the end pattern 16.

Whilst the bubble is in the stable position, a current pulse is applied to the extension conductor (not shown) in order to extend the bubble between the minor loop 2 and the major loop 4. This extended bubble is denoted by the reference numeral 28 in FIG. 4d. Whilst the bubble is extended, a current pulse is applied to the breaking conductor (not shown) in order to split or break the extended bubble 28, which brings about the duplication as shown in FIG. 4e.

Each of the two magnetic bubbles (the mother bubble on the minor loop 2 and the daughter bubble on the major loop 4) then move as a function of the phase of the rotary field $H_T$, in the manner shown in FIGS. 4f, 4g and 4h.

The stability of the magnetic bubble in the duplication position on the minor loop makes it possible to have a better phase margin for the extension and breaking pulses, with respect to the phase of the rotary field $H_T$ than in the known devices.

Figure 5:
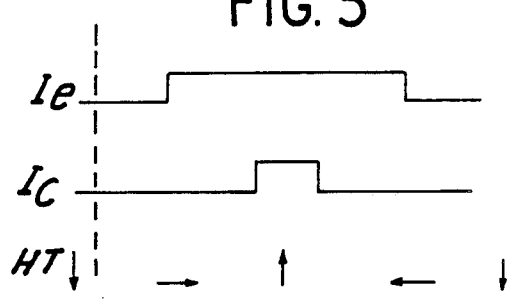
FIG. 5 is a timing diagram of the extension and breaking current pulses for the duplication of a magnetic bubble by means of the duplicator according to the invention.

FIG. 5 shows a timing diagram illustrating the extension Ie and breaking Ic current pulses, as a function of the phase of the rotary field $H_T$, which is represented by an arrow having the same meaning as in FIG. 4.

The extension pulse Ie is present throughout the stability period of the bubble in the duplicated position. However, this is not imperative and the width of the extension pulse Ie can be reduced without any disadvantage being suffered. However, preferably, this extension pulse Ie is centered on the time where the phase of the rotary field $H_T$ is zero (FIG. 4d).

According to the invention, the breaking pulse Ic starts when the extension conductor is activated. Preferably, this breaking pulse ends before the end of the extension pulse. This pulse is preferably present when the phase of the rotary field $H_T$ is zero (FIG. 4d).

Thus, as a result of the stability of the duplication position of the minor loop, the current pulses Ie and Ic can be triggered with a significant phase latitude compared with the phase of the rotary field $H_T$. This permits an easier and more reliable duplication.

It is known that a large amplitude current pulse in the extension conductor is liable to bring about the nucleation of a bubble in the duplication position of the end pattern 16 of the minor loop 2 shown in FIG. 3. FIG. 6 shows a constructional variant of said end pattern, which makes it possible to obtain better pulse amplitude operating margins.

The shape of this end pattern 30 makes the nucleation of a bubble more difficult in the duplication position constituted by the implanted zone 18. This end pattern 30 has a central implanted zone 32 and an implanted gap 34 connecting said zone 32 to said zone 18. The implanted gap 34, which is identical to implanted gap 22 formed between two non-implanted patterns 24 of the major loop 4 (FIG. 3), makes the nucleation of a bubble more difficult.

Figure 7:
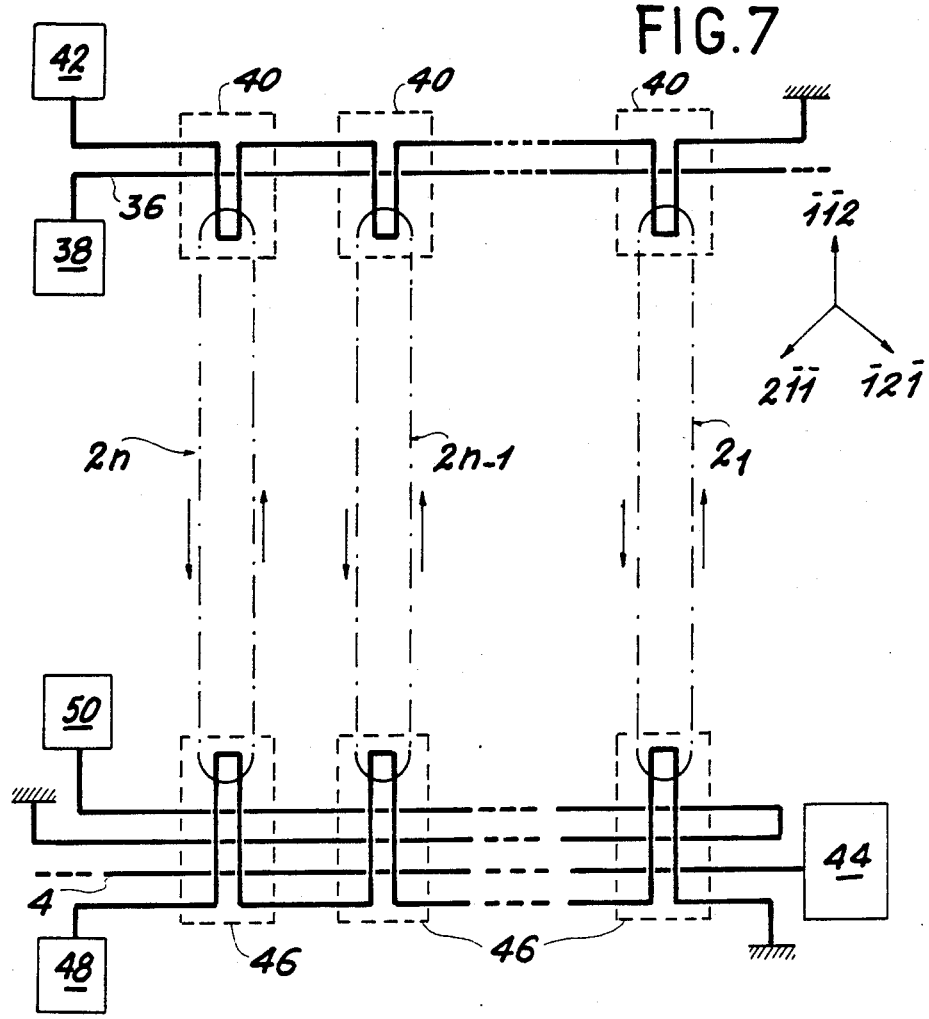
FIG. 7 is a diagrammatic view of the structure of a bubble memory with non-implanted patterns of the serial-parallel type, whose duplicators have two conductors.

FIG. 7 is a diagrammatic drawing of a bubble memory whose duplication gates or ports can be advantageously those of the present invention.

In a conventional manner, this bubble memory has n minor loops $2_1, 2_2 \ldots 2_n$ oriented in accordance with an easy magnetization axis $\overline{112}$ of the memory. This memory also comprises a major writing loop 36 connected to a means 38 for generating bubbles. Transfer gates 40 formed e.g. by a U-shaped conductor makes it possible to transfer a bubble from major loop 36 to a minor loop. These transfer gates can be interconnected in series and thus, as a result of the application of a transfer pulse by a pulse generator 42, make it possible to simultaneously transfer bubbles from the major loop 36 into each of the minor loops.

The memory also comprises a major reading loop 4, which is connected to a detector 44, which is often of the magnetoresistive type. The reading of the bubbles of the minor loops takes place, as stated hereinbefore, via duplicators 46. Each of these duplicators comprises a, for example, U-shaped extension conductor 6 and a breaking conductor 8, positioned between a minor loop and the major reading loop 4, as described with reference to FIG. 3.

The conductors of each of these duplicators can advantageously be connected in series so that, via an extension pulse generator 48 and a breaking pulse generator 50, it is possible to simultaneously duplicate each bubble in the duplication positions of the respective minor loops in the major reading loop 4.

What is claimed is:

1. A duplicator in a magnetic bubble memory comprising a magnetic material layer in which magnetic bubbles can be displaced by the application of a rotary field $H_T$ in accordance with first and second propagation paths, the first path being defined by a first group of non-implanted patterns aligned along a planar crystallographic axis for the easy magnetization of the magnetic material, the second path being defined by a second group of non-imparted patterns aligned along an axis positioned transversely with respect to the axis of the first group of patterns, wherein said duplicator comprises a bubble extension conductor, a bubble splitting conductor, means for generating an extension pulse coupled to said bubble extension conductor and means for generating a splitting pulse coupled to said bubble splitting conductor, the extension conductor being positioned between the end pattern of the first group of patterns and the second group of patterns, the bubble splitting conductor being positioned transversely with respect to the bubble extension conductor between the two groups of patterns, the shape of the ends of the patterns of the first group of patterns forming bubble stable positions at the duplication location on each first propagation path at the said end and the shape of the second group of patterns forming bubble stable positions at the corresponding reception location of the duplicated bubble on the second propagation path, the extension pulse generating means applying an extension pulse to said bubble extension conductor and the splitting pulse generating means applying a splitting pulse to said bubble splitting conductor, said extension pulse starting before said splitting pulse and coinciding in time with the time during which the bubble to be duplicated is stationary in the duplication position, and said splitting pulse starting and ending before the end of the duration of said extension pulse.

2. A duplicator according to claim 1, wherein an implanted gap is formed between two patterns of the second group of patterns along the axis of the extension conductor.

3. A duplicator according to claim 1, wherein an implanted zone is formed in the end pattern facing the second group of non-implanted patterns.

4. A duplicator according to claim 3, wherein a central implanted zone is formed in the center of the end pattern and wherein an implanted gap centered on the axis of the first group of patterns is contiguous with said central implanted zone.

5. A duplication process for duplicating magnetic bubbles in a magnetic bubble memory comprising a magnetic material layer in which the magnetic bubbles can be displaced along first and second propagation paths by the application of a rotary field, the first propagation path being defined by a first group of non-implanted patterns aligned along a planar crystallographic axis for the easy magnetization of the magnetic material and having a stable duplication location therealong and at the end of said first path, the second propagation path being defined by a second group of non-implanted patterns aligned along an axis positioned transversely with respect to the axis of the first group of patterns and having a stable reception position therealong corresponding to said end of said first propagation path, the stable positions being determined by the shape of the end pattern of said first propagation path and by the shape of the corresponding pattern of said second propagation path, and further comprising a bubble extension conductor and a bubble splitting conductor arranged between the first and second groups of patterns in a mutually transverse relationship, in which a current pulse is applied to said bubble extension conductor and a current pulse is applied to said bubble splitting conductor, the extension pulse starting before the splitting pulse, wherein the extension pulse is produced within the time during which a bubble is stationary in said duplication location, and said splitting pulse starts and ends before the end of the duration of said extension pulse.

6. A duplicator in a magnetic bubble memory comprising a magnetic material layer in which magnetic bubbles can be displaced by the application of a rotary field $H_T$ in accordance with first and second propagation paths, the first path being defined by a first group of non-implanted patterns aligned along a planar crystallographic axis for the easy magnetization of the magnetic material, the second path being defined by a second group of non-implanted patterns aligned along an axis positioned transversely with respect to the axis of the first group of patterns, wherein said duplicator comprises (a) a bubble extension conductor having a U-shaped portion overlying an end portion of the first group of patterns, the area between said end portion of the first group of patterns and the second group of patterns, and portions of the second group of patterns;

(b) a bubble splitting conductor having a U-shaped portion arranged between said end portion of the first group of patterns and the second group of patterns and positioned with respect to said bubble extension conductor whereby the parallel legs of said U-shaped portion of said bubble splitting conductor are transverse to the parallel legs of said U-shaped portion of said bubble extension conductor;

(c) an extension pulse generating means connected to said bubble extension conductor; and (d) a splitting pulse generating means connected to said bubble splitting conductor, said end portion of the first group of patterns having a geometry defining a duplication location on the first propagation path, and the second propagation path having a geometry defining a reception location of the duplicated bubble between the parallel legs of said U-shaped portion of said bubble extension conductor, said duplication and reception locations being stable bubble positions, said extension pulse generating means applying an extension pulse to said bubble extension conductor and said splitting pulse generating means applying a splitting pulse to said bubble splitting conductor, said extension pulse starting before said splitting pulse and coinciding in time with the time during which the bubble to be duplicated is stationary in the duplication position, and said splitting pulse starting and ending before the end of the duration of said extension pulse.

* * * * *